United States Patent
Yamazaki et al.

[11] Patent Number: 5,858,473
[45] Date of Patent: *Jan. 12, 1999

[54] LASER PROCESS

[75] Inventors: Shunpei Yamazaki, Tokyo; Hongyong Zhang; Hiroaki Ishihara, both of Kanagawa, all of Japan

[73] Assignee: Semiconductor Energy Laboratory Co., Ltd., Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 709,108

[22] Filed: Sep. 6, 1996

Related U.S. Application Data

[63] Continuation of Ser. No. 409,929, Mar. 23, 1995, abandoned, which is a continuation of Ser. No. 81,696, Jun. 25, 1993, abandoned.

[30] Foreign Application Priority Data

Jun. 26, 1992 [JP] Japan .................................. 4-193005
Aug. 27, 1992 [JP] Japan .................................. 4-252295

[51] Int. Cl.$^6$ .............................. B05D 3/00; C23C 14/14
[52] U.S. Cl. ........................ 427/554; 427/527; 438/522; 438/530; 438/535
[58] Field of Search ..................... 427/554, 555, 427/559, 523, 526, 527, 561, 562, 568; 437/21, 25, 26, 28, 36, 173, 174; 438/535, 513, 514, 515, 522, 530, 491, 517

[56] References Cited

U.S. PATENT DOCUMENTS

| | | | |
|---|---|---|---|
| 4,151,008 | 4/1979 | Kirkpatric | 437/31 |
| 4,198,246 | 4/1980 | Wu | 427/554 |
| 4,309,224 | 1/1982 | Shibata | 427/555 |
| 4,309,225 | 1/1982 | Fan et al. | |
| 4,370,175 | 1/1983 | Levatter | 427/554 |
| 4,379,727 | 4/1983 | Hansen et al. | 427/555 |
| 4,431,459 | 2/1984 | Teng | 427/553 |
| 4,462,150 | 7/1984 | Nishimura et al. | 427/555 |
| 4,468,855 | 9/1984 | Sasaki | 427/555 |
| 4,473,433 | 9/1984 | Bosch et al. | 427/555 |
| 4,500,365 | 2/1985 | Mori | 427/555 |
| 4,536,231 | 8/1985 | Kasten | 437/174 |
| 4,646,426 | 3/1987 | Sasuki | 427/526 |
| 5,264,383 | 11/1993 | Young | 437/40 |
| 5,306,651 | 4/1994 | Masumo et al. | 437/173 |
| 5,401,666 | 3/1995 | Tsukamoto | 437/174 |
| 5,403,762 | 4/1995 | Takemura | 437/173 |
| 5,424,244 | 6/1995 | Zhang et al. | 437/173 |

OTHER PUBLICATIONS

Chrisey et al, ed. *Pulsed Laser Deposition of Thin Films*, sec. 2.2.2 "Excimer Discharge Design" pp. 27–29; A Wiley–Interscience Publication, John Wiley & Sons, Inc. N.Y., 1994, No Month.

*Primary Examiner*—Marianne Padgett
*Attorney, Agent, or Firm*—Sixbey, Friedman, Leedom & Ferguson, PC; Gerald J. Ferguson, Jr.; Eric J. Robinson

[57] ABSTRACT

A laser annealing process for recovering crystallinity of a deposited semiconductor film such as of silicon which had undergone morphological damage, said process comprising activating the semiconductor by irradiating a pulsed laser beam operating at a wavelength of 400 nm or less and at a pulse width of 50 nsec or less onto the surface of the film, wherein, said deposited film is coated with a transparent film such as a silicon oxide film at a thickness of from 3 to 300 nm, and the laser beam incident to said coating is applied at an energy density E (mJ/cm$^2$) provided that it satisfies the relation:

$$\log_{10} N \leq -0.02(E-350),$$

where N is the number of shots of the pulsed laser beam.

22 Claims, 7 Drawing Sheets

LASER PROCESS

This application is a Continuation of Ser. No. 08/409,929, filed Mar. 23, 1995 now abandoned; which itself is a continuation of Ser. No. 08/081,696, filed Jun. 25, 1993, now abandoned.

BACKGROUND OF THE INVENTION

1. Field of the Invention

The present invention relates to a highly reliable laser annealing process suited for use in mass production of semiconductor devices, which enables uniform annealing at high yield. More particularly, the present invention provides a laser annealing process of a deposited film whose crystallinity had been greatly impaired by the damage it had received through processes such as ion irradiation, ion implantation, and ion doping.

2. Prior Art

At present, methods of lowering of process temperatures in fabricating semiconductor devices are extensively studied. The reason for such an active research for low temperature processes owe partly to the need for fabricating semiconductor elements on an insulator substrate made of, e.g., glass. Laser annealing technology is regarded promising as the ultimate low temperature process.

However, conditions for laser annealing are not yet established because conventional laser annealing processes were each conducted independently under differing conditions which depend upon the apparatuses and the coating conditions chosen individually in each process. This has misled and has allowed many to think that the laser annealing technology fails to give results reliable and consistent enough to make the process practically feasible. An object of the present invention is to establish, for the first time, the conditions for a laser annealing process which yields highly reproducible results.

SUMMARY OF THE INVENTION

In a process for fabricating a semiconductor device, a deposition film is considerably damaged by processing such as ion irradiation, ion implantation, and ion doping, and is thereby impaired in crystallinity as to yield an amorphous phase or a like state which is far from being called as a semiconductor. Accordingly, with an aim to use laser annealing in activating such damaged films, the present inventors have studied extensively how to optimize the conditions of laser annealing. During the study, it has been found that the optimum condition fluctuates not only by the energy control of the laser beam, but also by the impurities being incorporated in the film and by the number of pulse shots of the laser beam being applied thereto.

The deposited films to be activated by the process of the present invention are those containing, as the principal component, a Group IV element of the periodic table, e.g., silicon, germanium, an alloy of silicon and germanium, or a compound of the Group IV elements such as silicon carbide. The deposited film has a thickness of 100 Å to 10000 Å. By taking the light transmission into consideration, it is well established that the laser annealing of such films can be favorably conducted by applying a laser beam in the short wavelength region, and specifically, one of 400 nm or shorter.

The process of the present invention comprises the step of:

irradiating laser pulses having a wavelength of 400 nm or shorter and having a pulse width of 50nsec or less to a film comprising a Group IV element selected from the group consisting of carbon, silicon, germanium, tin and lead and having introduced thereinto an impurity ion, wherein a transparent film having a thickness of 3 to 300 nm is provided on said film comprising the Group IV element on the way of said laser pulses to said film comprising the Group IV element, an energy density E of each of said laser pulses in unit of mJ/cm$^2$ and the number N of said laser pulses satisfy relation $\log_{10} N \leq -0.02(E-350)$.

The laser pulses are emitted from a laser selected from the group consisting of a KrF excimer laser, an ArF excimer laser, a XeCl excimer laser and a XeF excimer laser. The introduction of the impurity ion is carried out by ion irradiation, ion implantation or ion doping. The film comprising the Group IV element is provided on an insulating substrate, and the insulating substrate is maintained at a temperature of room temperature to 500° C. during the irradiating step.

It had been believed that the sheet resistance can be lowered by applying a laser beam having an energy density sufficiently high for activation. In the case of a film containing phosphorus as an impurity, this tendency can be certainly observed. However, in a film containing boron as an impurity, the film undergoes degradation by the irradiation of a laser of such a high energy density. Moreover, it had been taken for granted that the increase in pulsed shots reduces fluctuation in properties of the laser annealed films. However, this is not true because it was found that the morphology of the coating deteriorates with increasing number of shots to increase fluctuations in a microscopic level.

This can be explained by the growth of crystal nuclei within the coating due to a laser beam irradiation being applied repeatedly to the film. As a result, a grain size distribution within a size-range of from 0.1 to 1 $\mu$m appears inside the coating which was previously composed of uniform sized grains. This phenomenon was particularly distinguished when a laser irradiation in the high energy region was applied.

It has been found that the deposited film (i.e. a semiconductor film) must be coated with (covered by) a light-transmitting coating from 3 to 300 nm in thickness instead of being exposed to atmosphere. The light-transmitting coating is preferably made from silicon oxide or silicon nitride from the viewpoint that it should transmit laser beam. More preferably, a material mainly comprising silicon oxide is used because, in general, it also serves as the gate dielectric. Needless to say, the light-transmitting film may be doped with phosphorus or boron with an aim to passivate the mobile ions. If the film containing a Group IV element should not be coated with such a light-transmitting coating, it happens that the uniformity is disturbed in a more accelerated manner.

It has been found also, that a further smoother (uniform) coating can be obtained by applying pulsed laser beam under a condition set forth above and additionally satisfying the following relation:

$$\log_{10} N \leq A(E-B)$$

where, E (mJ/cm$^2$) is the energy density of each of the irradiated laser pulses, and N (shots) is the number of shots of pulsed laser. The values for A and B are dependent on the impurities being incorporated in the coating. When phosphorus is present as the impurity, −0.02 for A and 350 for B are chosen, and an A of −0.02 and B of 300 are selected when boron is included as the impurity.

Similar effect can be attained by using a transparent substrate instead of the transparent film. That is, a laser process in accordance with the present invention comprises the steps of:

- introducing an impurity into a semiconductor film provided on a transparent substrate; and
- irradiating laser pulses having a wavelength of 400 nm or shorter and having a pulse width of 50 nsec or less to said semiconductor film through said transparent substrate, wherein an energy density E of each of said laser pulses in unit of mJ/cm$^2$ and the number N of said laser pulses satisfy relation $\log_{10} N \leq -0.02(E-350)$.

FIG.7(A) shows the introducing step, and FIG.7(B) shows the irradiating step. Reference numeral 71 designates the transparent substrate, and 72 designates the semiconductor film.

DETAILED DESCRIPTION OF THE INVENTION

The present invention is illustrated in greater detail referring to a non-limiting example below. It should be understood, however, that the present invention is not to be construed as being limited thereto.

EXAMPLE

Figure 1:
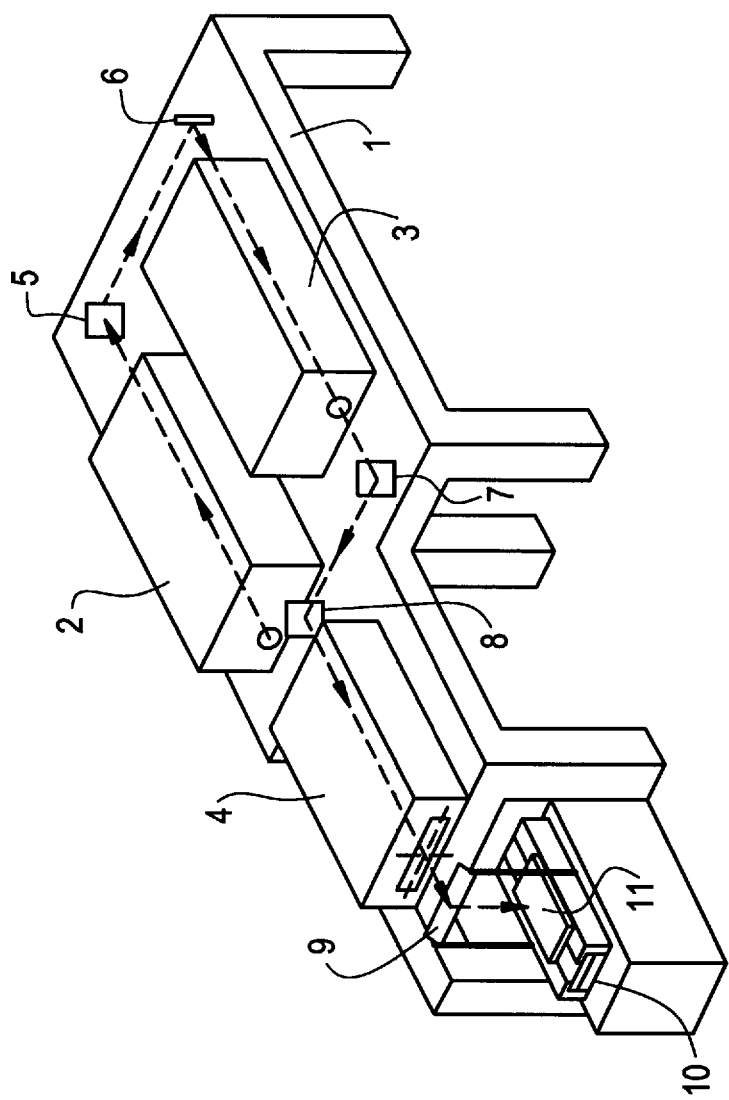
FIG. 1 shows a schematic view of a laser annealing apparatus having used in the embodiments of the present invention.

In this EXAMPLE, an impurity is introduced into a film comprising a Group IV element for imparting one of N-type conductivity and P-type conductivity thereto, and another impurity is introduced into a portion of the film with a mask for imparting the other one of the N-type conductivity and P-type conductivity to said portion. In FIG. 1 is shown schematically a laser annealing apparatus having used in the present example. A laser beam is generated in a generator 2, amplified in an amplifier 3 after traveling through full reflection mirrors 5 and 6, and then introduced in an optical system 4 after passing through full reflection mirrors 7 and 8. The initial laser beam has a rectangular beam area of about 3×2 cm$^2$, but is processed into a long beam having a length of from about 10 to 30 cm and a width of from about 0.1 to 1 cm by the optical system 4. The maximum energy of the laser having passed through this optical system was 1,000 mJ/shot.

Figure 5:
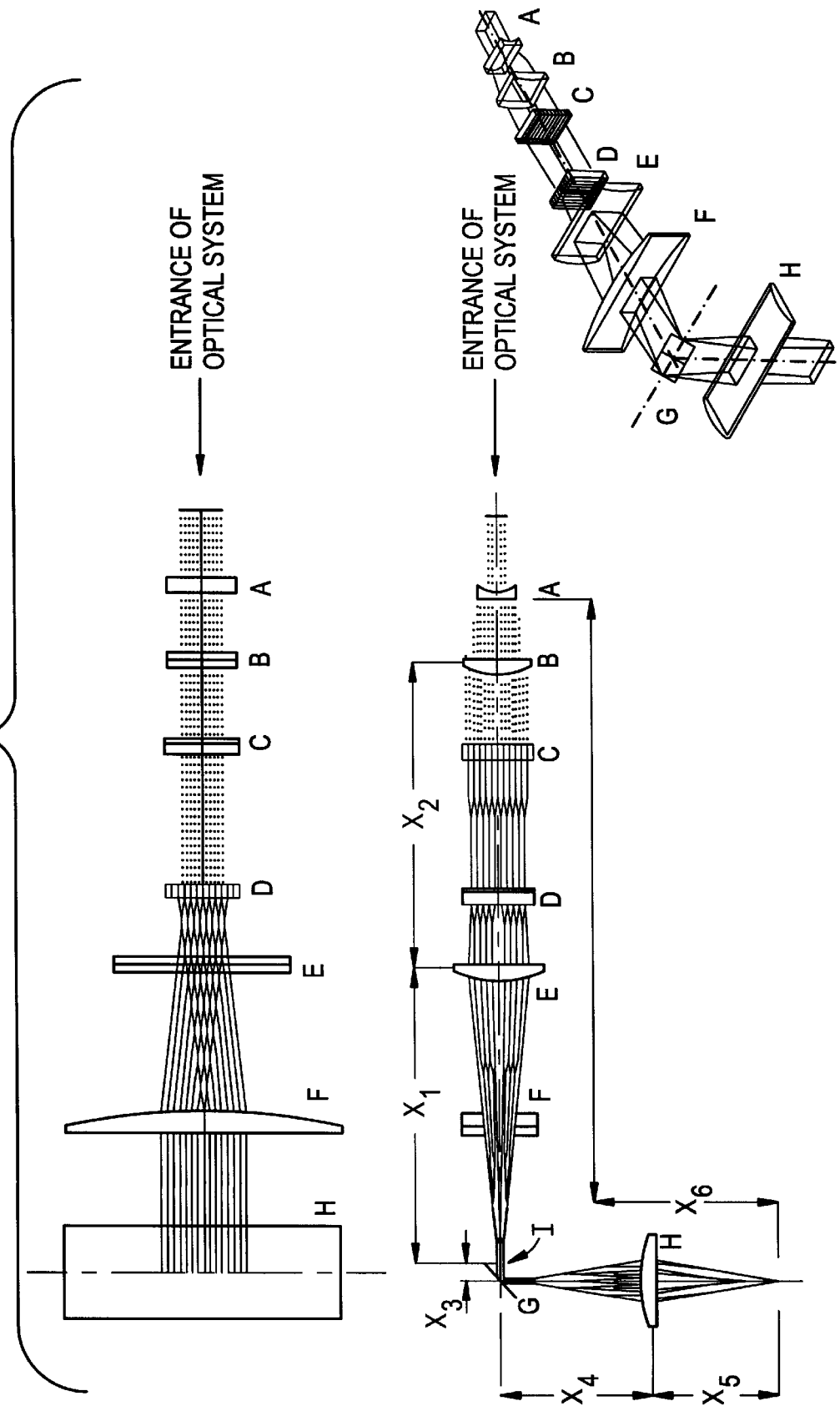
FIG. 5 shows a concept of an optical system of the laser annealing apparatus having used in the embodiments of the present invention.

An optical path in the optical system 4 is illustrated in FIG. 5. A laser light incident on the optical system 4 passes through a cylindrical concave lens A, a cylindrical convex lens B, a fly-eye lens C provided in a lateral direction and a fly-eye lens D provided in a vertical direction. The laser light is changed from an initial gauss distribution to a rectangular distribution by virtue of the fly-eye lenses C and D. Further, the laser light passes through a cylindrical convex lenses E and F and is reflected on a mirror G (a mirror 9 in FIG. 1) and is focused on the specimen by a cylindrical lens H.

In this EXAMPLE, distances $X_1$ and $X_2$ indicated in FIG. 5 are fixed, and a distance $X_3$ between a virtual focus I (which is generated by the difference between curved surfaces of the fly-eye lenses) and the mirror G, distances $X_4$ and $X_5$ are varied to adjust a magnification M and a focal length F. That is, $M=(X_3+X_4)/X_5$ $1/F=1/(X_3+X_4)+1/X_5$.

In this EXAMPLE, a total length $X_6$ of the optical path is about 1.3 m.

The initial beam is modified into a long-shaped one as above to improve processability thereof. More specifically, the rectangular beam which is irradiated onto a specimen 11 through the full reflection mirror 9 after departing the optical system 4 has a longer width as compared with that of the specimen that, as a consequence, the specimen need to be moved only along one direction. Accordingly, the stage on which the specimen is mounted and the driving apparatus 10 can be made simple structured that the maintenance operation therefor can be easily conducted. Furthermore, the alignment operation at setting the specimen can also be greatly simplified.

If a beam having a square cross section were to be employed, on the other hand, it becomes impossible to cover the entire substrate with a single beam. Accordingly, the specimen should be moved two dimensionally along two directions. In such circumstances, however, the driving apparatus of the stage becomes complicated and the alignment also must be done in a two dimensional manner that it involves much difficulty. When the alignment is done manually, in particular, a considerable time is consumed for this step to greatly reduce the productivity of the entire process. Furthermore, those apparatuses must be fixed on a stable table 1 such as a vibration proof table.

The specimen used in the example were various types of glass substrates (e.g., a Corning #7059 glass substtate) 100 mm in length and from 100 to 300 mm in width. A KrF laser emitting light at a wavelength of 248 nm and at a pulse width of 50 nsec or less, e.g. 30 nsec, was used in the process.

Figure 6A:
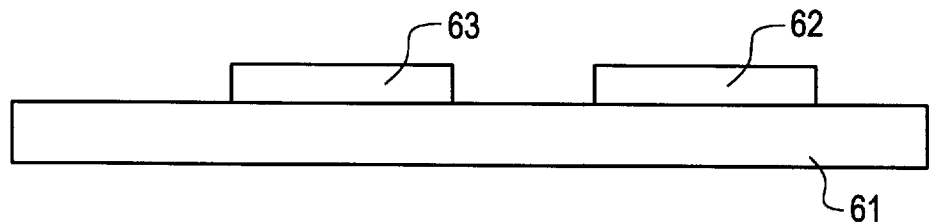
FIGS. 6(A), 6(B), 6(C) and 6(D) a laser annealing process in accordance with the present invention.
Figure 6B:
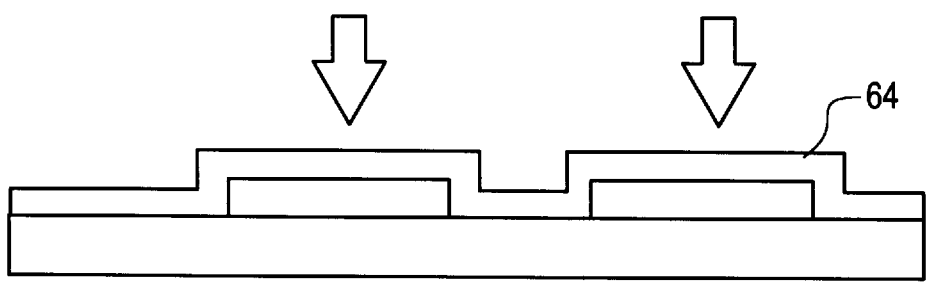
Figure 6C:
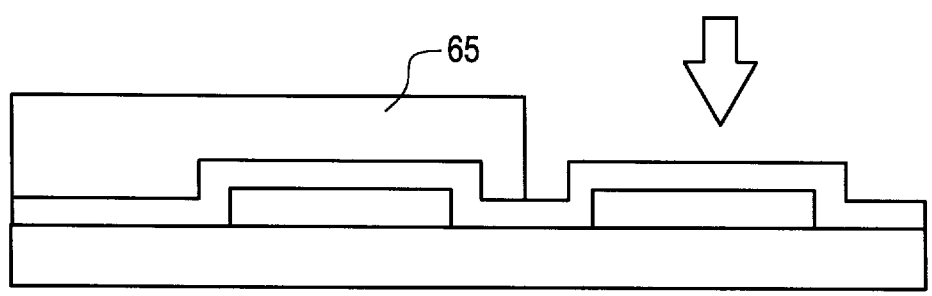

A 100 nm thick amorphous silicon film was deposited on a glass substrate 61 by plasma assisted CVD (chemical vapor deposition) process. The resulting film was annealed at 600° C. for 48 hours to obtain a crystallized film, and was patterned to make island-like portions 62 and 63 (FIG. 6(A)). Furthermore, a 70 nm thick silicon oxide film (a light-transmitting coating) 64 was deposited thereon by sputtering and the entire surface of the substrate was doped with phosphorus. A so-called ion doping process (FIG. 6(B)) was employed in this step using phosphine (PH$_3$) as the plasma source and an accelerating voltage of 80 kV. Furthermore, a part of the substrate was masked 65 to implant boron by ion doping process (FIG. 6(C)). Diborane ($B_2H_6$) was used as the plasma source in this step while accelerating at a voltage of 65 kV. More specifically, phosphorus was implanted (introduced) into the masked portions through the light-transmitting coating to obtain portion having rendered N-type conductive, while both phosphorus and boron were implanted (introduced) into the unmasked portions through the light-transmitting coating to result in a portion having rendered P-type conductive.

Then, laser beam was irradiated to the island-like portions (semiconductor film) while varying the energy density and the number of pulse shots to effect laser activation. The sheet resistance was measured accordingly and the morphology of the crystallites constituting the coating was observed through an optical microscope. The results are summarized in FIGS. 2 to 4.

Figure 2:
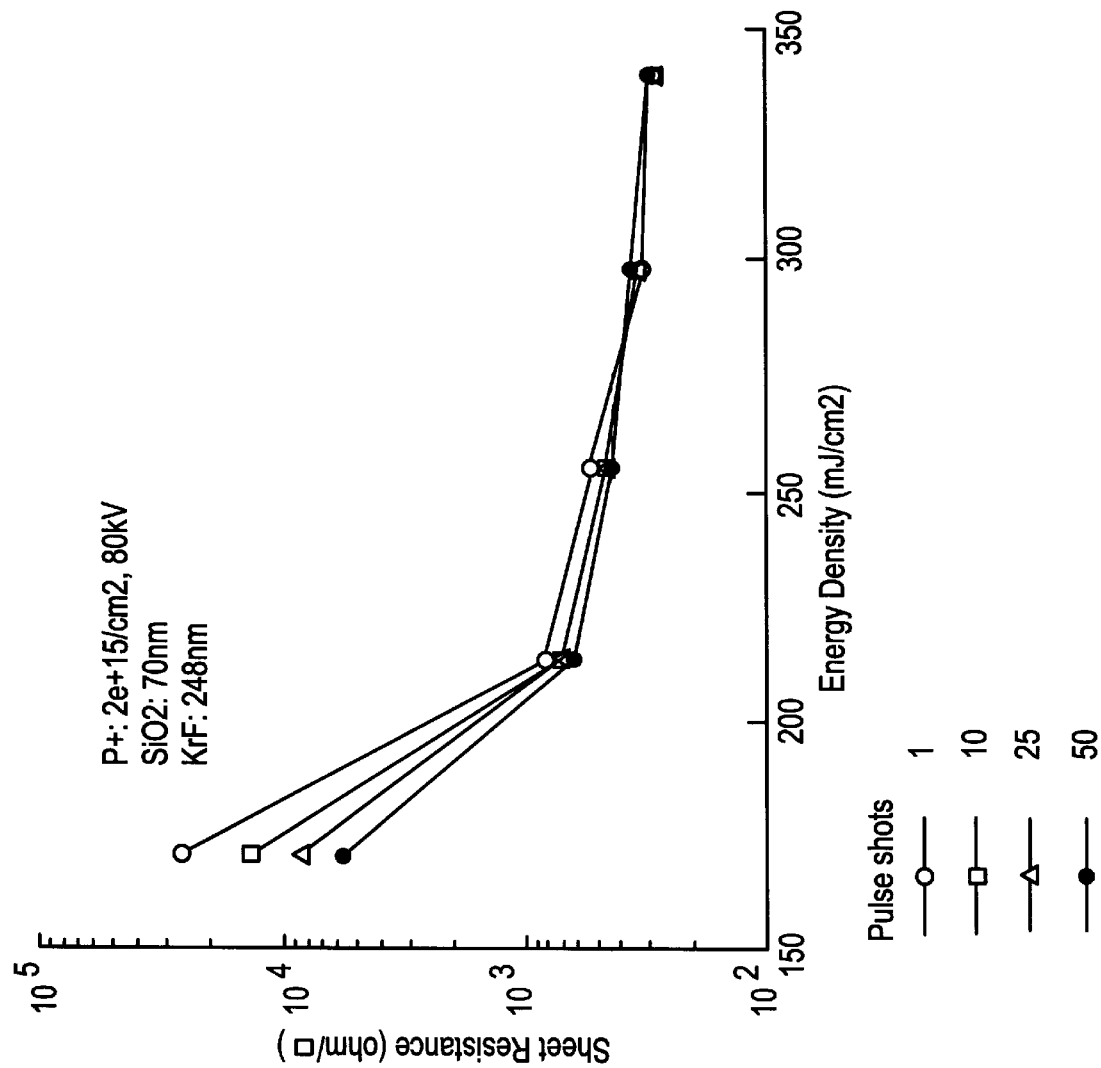
FIG. 2 is a graph showing the relationship between the sheet resistance of a silicon film (phosphorus-doped, N-type) obtained by laser annealing according to an embodiment of the present invention and the applied laser energy density, while changing the repetition times of pulse shots.

FIG. 2 shows a graph which relates the sheet resistance of a silicon film having doped with phosphorus ions with the energy density of the laser beam while also changing the repetition of the pulse shots. Phosphorus was incorporated into the silicon film at a dose of $2 \times 10^{15}$ cm$^{-2}$. With a laser being operated at an energy density of 200 mJ/cm$^2$ or less, a large number of shots were necessary to activate the sheet, yet with a poor result yielding a high sheet resistance of about 10 kΩ/sq. However, with a laser beam having an energy density of 200 mJ/cm$^2$ or higher, a sufficient activation was realized with a laser operation of from 1 to 10 shots.

Figure 3:
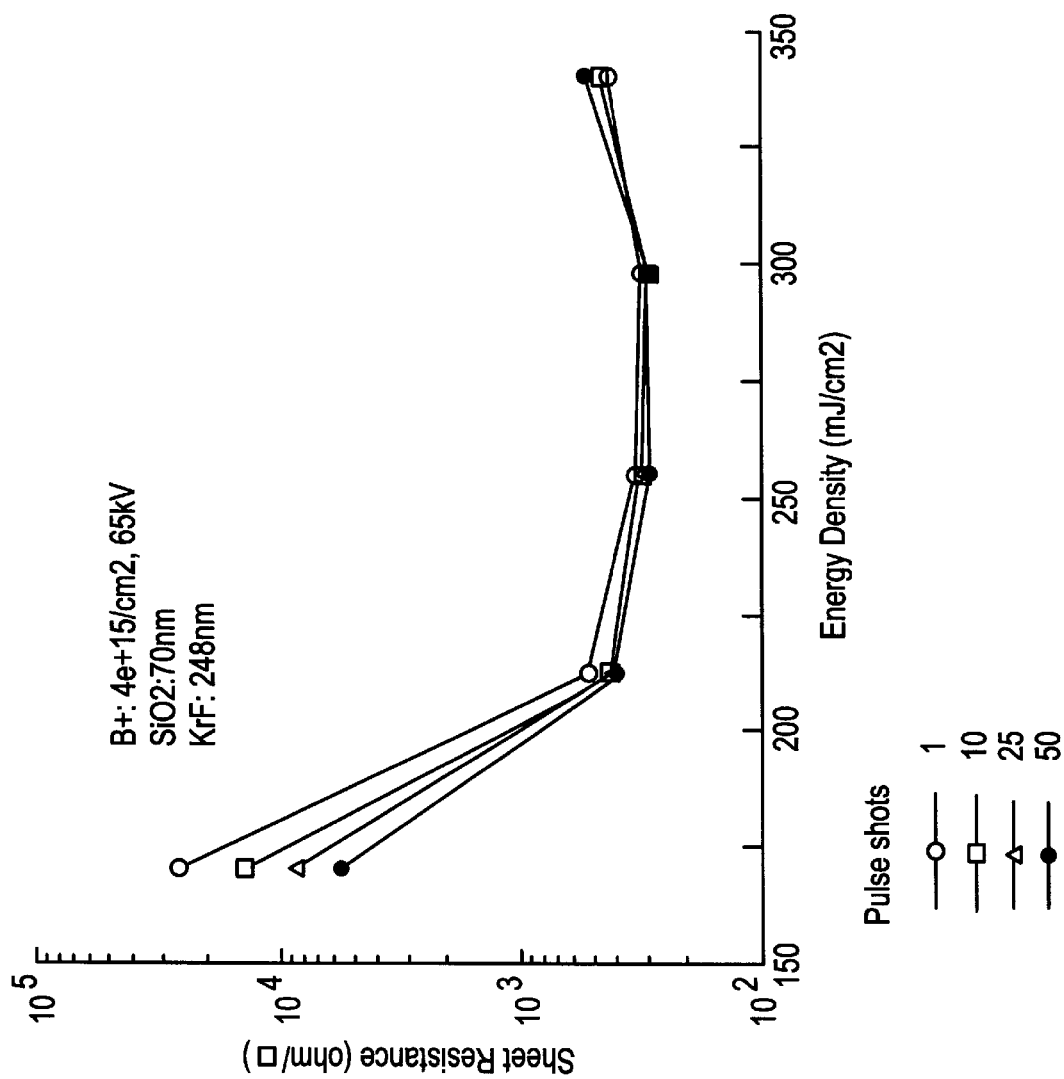
FIG. 3 is a graph showing the relationship between the sheet resistance of a silicon film (phosphorus- and boron-doped, P-type) obtained by laser annealing according to an embodiment of the present invention and the applied laser energy density, while changing the repetition times of pulse shots.

In FIG. 3 is shown the results for laser activating a silicon film doped with boron ions at a dose of $4 \times 10^{15}$ cm$^{-2}$. In this case again, activation could be conducted only insufficiently with an energy density of 200 mJ/cm$^2$ or lower that a large number of pulse shots was required for sufficient activation. With a laser beam operated at an energy density of from 200 to 300 mJ/cm$^2$, a sufficiently low sheet resistance was obtained with 1 to 10 shots. However, with laser being operated at an energy density of 300 mJ/cm$^2$ or higher, on the other hand, the sheet resistance was reversely elevated. In particular, contrary to the case of activating with a laser beam energy density of 200 mJ/cm$^2$ or lower, the sheet resistance was elevated with increasing repetition of pulse shots. This phenomenon can be explained by the growth of grain boundary due to the impaired homogeneity of the film which had resulted by applying laser irradiation for too many shots.

Figure 6D:
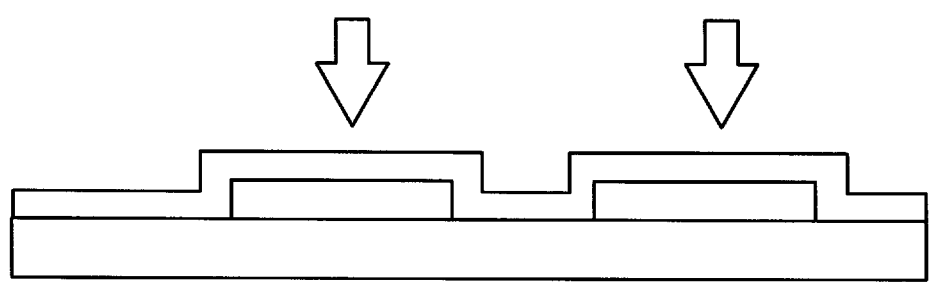
Figure 7A:
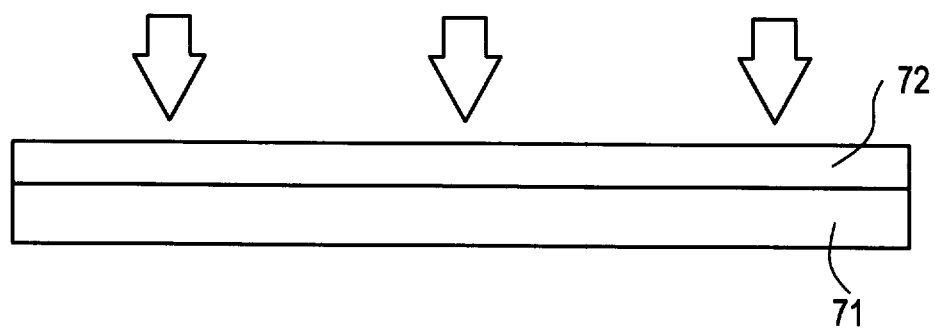
FIGS. 7(A) and 7(B) illustrate another laser annealing process in accordance with the present invention.
Figure 7B:
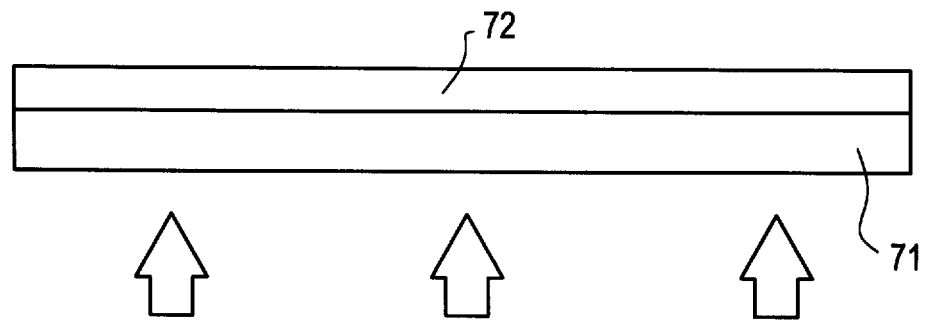

In a practical process, the laser annealing is applied simultaneously to both P- and N-type regions as shown in FIG. 6(D). This signifies that a laser beam being irradiated at an energy density of 350 mJ/cm$^2$ sufficiently activates the N-type region while impairing the properties of the P-type region. Accordingly, in the process according to the present example, it is preferred that the laser beam is operated in an energy density range of from 200 to 300 mJ/cm$^2$, and more preferably, in a range of from 250 to 300 mJ/cm$^2$. The pulse repetition is preferably in the range of from 1 to 100 pulses.

Figure 4:
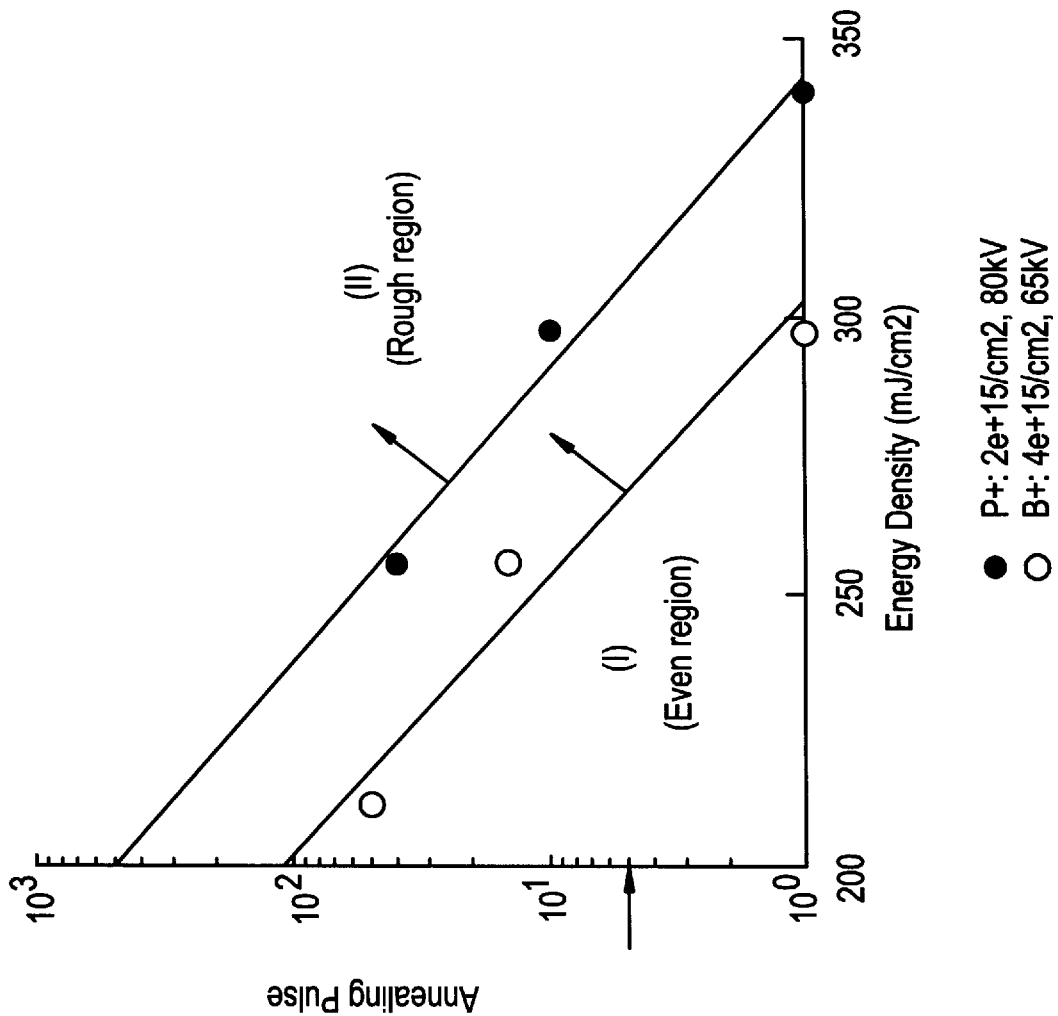
FIG. 4 is a graph showing the relation between the morphology of the silicon film obtained in an embodiment of the present invention and the applied laser energy density and the repetition times of the pulse shots.

As described in the foregoing, the morphology of the deposited film is considerably influenced by laser annealing. In fact, the number of pulse shots can be related to the laser beam energy density and the film morphology as illustrated in FIG. 4. In FIG. 4, the term "Annealing Pulse" signifies the number of laser beam pulse shots. The solid circle in the figure represents the point at which a change in surface morphology was observed on a phosphorus-doped silicon, and the open circle represents the same on a boron-doped silicon. The upper region on the right hand side of the figure corresponds to a condition which yields poor morphology on the surface (rough surface), and the lower region on the left hand side of the figure corresponds to that which yields favorable morphology on the surface (smooth surface). It can be seen from the results that the phosphorus-doped silicon has a strong resistance against laser irradiation. Accordingly, the condition for conducting laser annealing without impairing the surface morphology can be read to be such which satisfies the relation :

$$\log_{10} N \leq A(E-B),$$

where, E (mJ/cm$^2$) is the energy density of the irradiated laser beam, and N (shots) is the number of shots of pulsed laser. The values for A and B are A=−0.02 and B=350 in the case phosphorus is incorporated as the impurity, and are A=−0.02 and B=300 when boron is included as the impurity.

When the morphology of the deposited film is considerably impaired, the characteristic values show large scattering due to the serious drop which occurs locally in the properties of silicon. In fact, a scattering in sheet resistance as high as 20% or even more was observed on a silicon film having a defective morphology (a rough surface). This scattering can be removed by satisfying the conditions above and by setting the laser energy density at a pertinent value.

For instance, when a laser energy density is set at 250 mJ/cm$^2$, the pulsed laser beam is shot 10 times or less. If the energy density is elevated to 280 mJ/cm$^2$, the laser beam is preferably shot from 1 to 3 times. By conducting laser annealing under such conditions, the sheet resistance could be controlled within a fluctuation of 10% or less.

According to the present invention, a highly reliable semiconductor film having low fluctuation in properties was obtained by setting the optimal conditions for laser annealing as described in the foregoing. It can be seen therefore that the process according to the present invention is beneficial to the semiconductor industry.

While the invention has been described in detail and with reference to specific embodiments thereof, it will be apparent to one skilled in the art that various changes and modifications can be made therein without departing from the spirit and scope thereof.

What is claimed is:

1. A laser process comprising steps of:
    forming a transparent film covering a semiconductor film over a substrate;
    introducing phosphorus into said semiconductor film through said transparent film by ion doping;
    irradiating said film with a beam of excimer laser pulses in order to activate said phosphorus in said semiconductor film where the laser pulses have a wavelength of 400 nm or shorter;
    wherein an energy density E of each of said laser pulses in units of mJ/cm$^2$ and the number N of said laser pulses satisfies the relation $\log_{10} N < -0.02(E-350)$ where N is not less than one and not greater than 10 and said energy density E is not less than 200 mJ/cm$^2$.

2. The process according to claim 1 wherein said semiconductor film comprises silicon.

3. The process according to claim 1 wherein said energy density is within a range from 200 to 300 mJ/cm$^2$.

4. The process according to claim 1 wherein said irradiation is carried out with said substrate at a temperature in a range of room temperature to 500° C.

5. A laser process comprising steps of:
    forming a transparent film covering a semiconductor film over a substrate;
    introducing boron into said semiconductor film through said transparent film by ion doping;

irradiating said film with a beam of excimer laser pulses in order to activate said boron in said semiconductor film where the laser pulses have a wavelength of 400 nm or shorter;

wherein an energy density E of each of said laser pulses in units of mJ/cm$^2$ and the number N of said laser pulses satisfies the relation $\log_{10} N < -0.02(E-300)$ where N is not less than one and not greater than 10 and said energy density E is not less than 200 mJ/cm$^2$.

6. The process according to claim 5 wherein said semiconductor film comprises silicon.

7. The process according to claim 5 wherein said irradiation is carried out at a temperature in a range of room temperature to 500° C.

8. The process according to claim 5 wherein said energy density is within a range from 200 to 300 mJ/cm$^2$.

9. A laser process comprising steps of:

introducing phosphorus into a semiconductor film provided on a transparent substrate by ion doping;

irradiating said semiconductor film with a beam of excimer laser pulses in order to activate said phosphorus in said semiconductor film where the laser pulses have a wavelength of 400 nm or shorter;

wherein an energy density E of each of said laser pulses in units of mJ/cm$^2$ and the number N of said laser pulses satisfies the relation $\log_{10} N < -0.02(E-350)$ where N is not less than one and not greater than 10 and said energy density E is not less than 200 mJ/cm$^2$.

10. The process according to claim 9 wherein said semiconductor film comprises silicon.

11. The process according to claim 9 wherein said irradiation is carried out with said substrate at a temperature in a range of room temperature to 500° C.

12. A laser process comprising steps of:

introducing boron into a semiconductor film provided on a transparent substrate by ion doping;

irradiating said semiconductor film with a beam of excimer laser pulses in order to activate said boron in said semiconductor film where the laser pulses have a wavelength of 400 nm or shorter;

wherein an energy density E of each of said laser pulses in units of mJ/cm$^2$ and the number N of said laser pulses satisfies the relation $\log_{10} N < -0.02(E-300)$ where N is not less than one and not greater than 10 and said energy density E is not less than 200 mJ/cm$^2$.

13. The process according to claim 12 wherein said semiconductor film comprises silicon.

14. The process according to claim 12 wherein said irradiation is carried out with said substrate at 500° C. or lower.

15. A process of manufacturing a semiconductor device comprising steps of:

forming a crystalline semiconductor film comprising silicon over a substrate;

introducing phosphorus into portions of said semiconductor film by ion doping using phosphine gas;

activating said portions of the semiconductor film doped with the phosphorus by irradiating a beam of excimer laser pulses, wherein an energy density E of the laser pulses in units of mJ/cm$^2$ and a number N of said laser pulses satisfy the relation $\log_{10} N < -0.02(E-350)$ where N is not less than one and not greater than 10 and said energy density E is not less than 200 mJ/cm$^2$.

16. The process according to claim 15 wherein said semiconductor film is irradiated with said beam while maintaining said substrate at a temperature in a range of room temperature to 500° C.

17. The process according to claim 15 wherein said energy density is within a range from 200 to 300 mJ/cm$^2$.

18. The process according to claim 15 wherein a cross section of said beam has an elongated shape at said semiconductor film.

19. A process of manufacturing a semiconductor device comprising steps of:

forming a crystalline semiconductor film comprising silicon over a substrate;

introducing boron into portions of said semiconductor film with the boron by irradiating a beam of excimer laser pulses, wherein an energy density E of the laser pulses in units of mJ/cm$^2$ and a number N of said laser pulses satisfy the relation $\log_{10} N < -0.02(E-300)$ where N is not less than one and not greater than 10 and said energy density E is not less than 200 mJ/cm$^2$.

20. The process according to claim 19 wherein said semiconductor film is irradiated with said beam while maintaining said substrate at a temperature in a range of room temperature to 500° C.

21. The process according to claim 19 wherein said energy density is within a range from 200 to 300 mJ/cm$^2$.

22. The process according to claim 19 wherein a cross section of said beam has an elongated shape at said semiconductor film.

* * * * *

UNITED STATES PATENT AND TRADEMARK OFFICE
CERTIFICATE OF CORRECTION

PATENT NO : 5,858,473
DATED : January 12, 1999
INVENTOR(S) : Yamazaki et al.

It is certified that error appears in the above-identified patent and that said Letters Patent is hereby corrected as shown below:

Column 8, line 32 (claim 19, line 6), after "film" insert the following:

--by ion doping using diborane gas;

activating said portions of the semiconductor film doped--.

Signed and Sealed this

Twenty-first Day of September, 1999

Attest:

Q. TODD DICKINSON

*Attesting Officer*  *Acting Commissioner of Patents and Trademarks*